US006657561B1

(12) United States Patent
Hanna

(10) Patent No.: US 6,657,561 B1
(45) Date of Patent: Dec. 2, 2003

(54) DATA DECOMPRESSION SYSTEM AND METHOD

(75) Inventor: Stephen Dale Hanna, Boulder, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/570,823

(22) Filed: May 15, 2000

(51) Int. Cl.[7] .............................................. H03M 7/00
(52) U.S. Cl. .............................. 341/50; 341/59; 341/63; 382/245
(58) Field of Search ............................ 341/50, 59, 63; 382/245, 246

(56) References Cited

U.S. PATENT DOCUMENTS

| 4,937,681 | A | * | 6/1990 | Fujinawa et al. | 382/234 |
| 5,060,242 | A | | 10/1991 | Arbeiter | 375/122 |
| 5,572,209 | A | | 11/1996 | Farmer et al. | 341/67 |
| 5,673,209 | A | * | 9/1997 | Heiney et al. | 708/203 |
| 5,768,481 | A | | 6/1998 | Chan et al. | 395/102 |
| 5,778,253 | A | * | 7/1998 | Blair et al. | 710/68 |
| 5,790,705 | A | | 8/1998 | Anderson et al. | 382/244 |
| 5,903,715 | A | * | 5/1999 | Sawano | 358/1.15 |
| 6,016,360 | A | | 1/2000 | Nguyen et al. | 382/166 |
| 6,300,885 | B1 | * | 10/2001 | Davenport et al. | 341/50 |

* cited by examiner

Primary Examiner—Peguy Jeanpierre
(74) Attorney, Agent, or Firm—Kunzler & Associates

(57) ABSTRACT

A method and system for decompressing image data in a digital scanning system such as a printer. A plurality of streams of digital data are received in a compressed format. The compressed format contains a control byte preceding a plurality of data bytes. A initial RLE mode bit of the control byte indicates whether the following data bytes are run length encoded or not run length encoded and subsequent bits indicate a repeat amount. If the following data bytes are run length encoded, the decompression apparatus determines the number of times the data byte(s) are to be repeated at the output of the apparatus. In special cases where the repeat count is a zero, the mode bit may indicate that the data byte is to be repeated either to an end of scan marker or to an end of object marker. The RLE mode bit may also indicate that non-run length encoded data is to be passed through as-is, preferably in multiples of a selected integer number. The input data stream may be buffered and received with the use of a barrel shifter register having a plurality of slots. Control logic determines which slots are empty and fills one slot at a time. The run-length encoded and non-run length encoded data are combined at an output stage. A plurality of decompressed circuits may be present and may decode separate data streams in parallel for continuous submission to a print engine.

24 Claims, 8 Drawing Sheets

DATA DECOMPRESSION SYSTEM AND METHOD

BACKGROUND OF THE INVENTION

1. The Field of the Invention

The present invention relates to the field of digital scanning devices such as printers. More specifically, the present invention relates to the decompression of run length encoded image data in digital scanning devices.

2. The Relevant Art

Printer systems, such as the printer system 100 shown in FIG. 1, are configured to conduct a series of hardware and software operations on digital print data in preparation for printing. These hardware and software operations are often referred to as a pipeline. The digital print data is used by the printer 108 to form a print image on a printing surface. Suitable examples of the printer 108 include a scanning laser beam and an inkjet. An area of the print surface on which the image is formed is referred to as a picture element (PEL or pixel). One scan of the laser beam or inkjet across the print surface forms a row of pixels referred to as a scan row. The print image is formed by multiple scan rows being successively formed on the print surface. Often, the image is further broken up into objects, with a plurality of objects per page.

The types of data passing through the pipeline generally includes text, graphics, images and combinations of these elements. The density of dot placement in modem printers is constantly increasing, particularly with color printing that requires additional bits per PEL over monochrome printing. The time required for the data pipeline to transmit the data from the host computer 102 to the printer 108 is correspondingly increasing. To fully utilize the increasing speed capabilities of print engines, the pipeline of a printer system must be able to transfer data fast enough to supply a continuous stream of data to the printer 108. This allows the printer 108 to print data continuously.

The depicted printer system 100 utilizes data compression 106 and data decompression 110 to compress and decompress print data in such a manner that it may be transferred to the printer 108 as a high volume, continuous data stream. Data compression refers to a process that attempts to convert data in a given format into an alternative format requiring less space and bandwidth than the original. One example of a data compression format is JPEG. By using data compression and decompression in printer systems such as the printer system 100, it is possible to transmit data quickly enough to keep the printer 108 printing data continuously.

One further compression technique, referred to as run length encoding, converts a data stream of continuous pixel data into a code for transmission. In so doing, repeated identical bytes of the data stream frequently occur and can be passed in compressed code. For example, using one run length compression method, the pixel data line "aaaabbbbbbbcccccc22" is converted into the coded data "a4b7c5d2." The coded data consists of bytes of pixel information (a, b, c and d) and the number of those bytes that are the same (4, 7, 5 and 1). Each byte contains 8 bits of pixel information.

Once the print data is compressed in the print controller 104, the print data can be transmitted to the printer, for instance, across a PCI bus interface. Upon arriving at the printer 108, it becomes necessary to then decompress the print data. Prior art print engines are configured to decompress one incoming data stream at a time, typically, one PEL (which in color printers occupies one byte of print data) per clock cycle. Under this type of decompression scheme, the print engine is required to stop the printing process frequently while waiting for the incoming compressed data stream to be decompressed. This time expenditure in decompressing a data stream significantly slows the printing process.

From the above discussion, it can be seen that it would be beneficial to improve the performance of printing systems by providing a system and method for data decompression that is capable of decompressing incoming print data more quickly so as to supply a continuous stream of print data to a high capacity print engine.

OBJECTS AND BRIEF SUMMARY OF THE INVENTION

The data decompression system of the present invention has been developed in response to the present state of the art, and in particular, in response to the problems and needs in the art that have not yet been fully solved by currently available data decompression systems. Accordingly, it is an overall object of the present invention to provide a data decompression system that overcomes many or all of the above-discussed shortcomings in the art.

To achieve the foregoing object, and in accordance with the invention as embodied and broadly described herein in the preferred embodiment, an improved data decompression system and method are provided.

The data decompression method of the present invention may include receiving a plurality of parallel data streams of compressed print data each having a plurality of bytes into a storage stage such as a barrel shifter. The barrel shifter is fed in groups of bytes as space opens up. The bytes are selected for decompression, and a control byte is selected out. The control byte indicates initially whether the following byte or bytes are run length encoded or not. If not, a number of data bytes, as indicated in the control byte, are passed straight through to the print engine. If the control byte indicates that the following data byte is run length encoded, the control byte also indicates how many times to repeat the data byte. Preferably, the byte is repeated a multiple of the indicated number of times. The process then repeats by selecting the control byte of the next string of bytes.

Additionally, a plurality of such decompression circuits may be operating at one time within a decompression circuit of a color interface card, and a plurality of color interface cards may be resident, each providing decompressed print data to a separate print head. The plurality of decompression circuits are multiplexed within the decompression circuits. Thus, a plurality of parallel data streams are concurrently decompressed. The data decompression system and method are designed to be lossless, simple, efficient, and high capacity in order to enable such a parallel decompression operation.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 2:
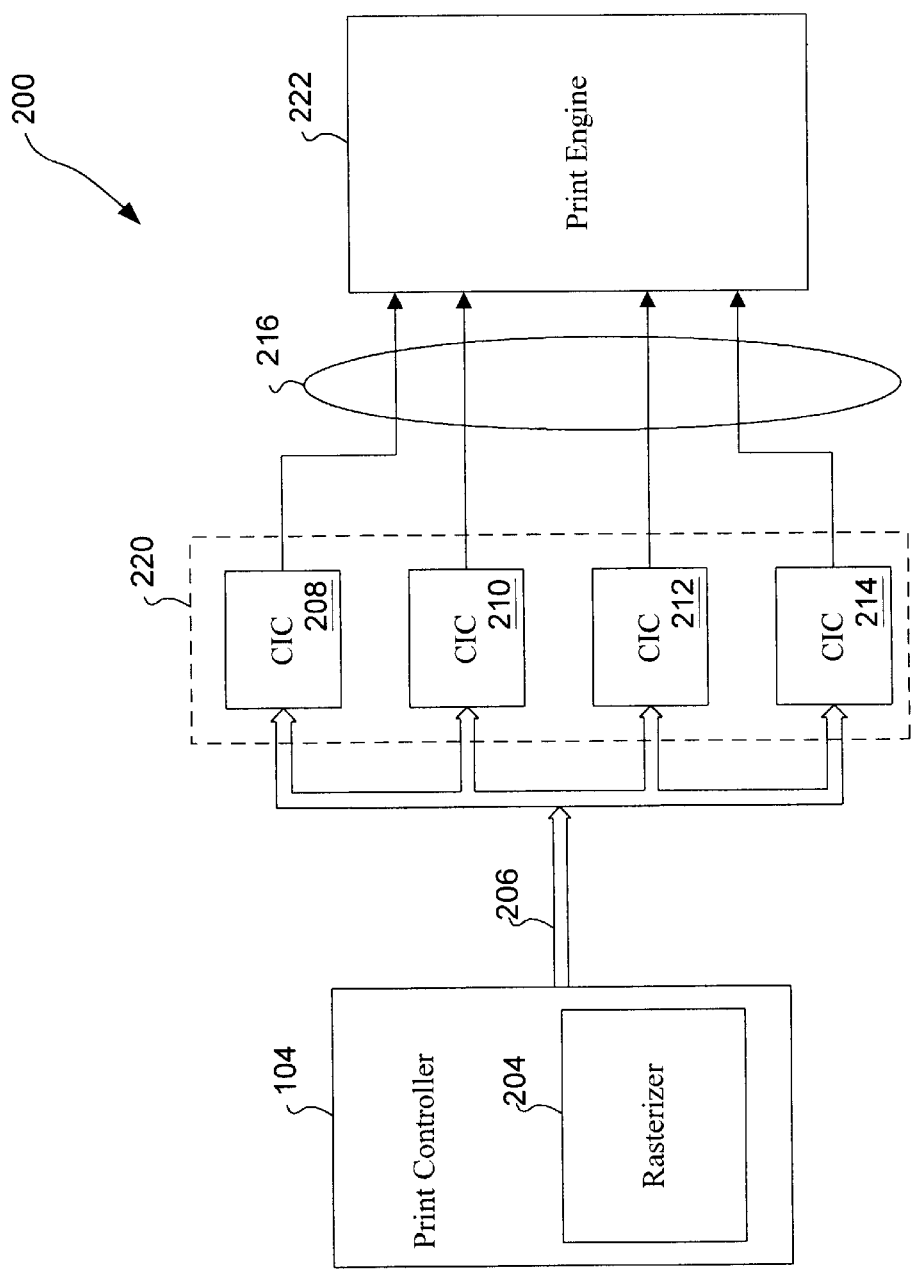
FIG. 2 is a schematic block diagram that illustrates one embodiment of a color printing system.

FIG. 2 illustrates one embodiment of a printing system 200 suitable for incorporating the data decompression system and method of the present invention. In one embodiment, the printing system 200 includes a print controller 104, a plurality of color interface cards (CIC) 220, and a print engine 222. The print controller 104 may include a rasterizer 204. The rasterizer 204 preferably makes a raster image of print data, then compresses the print data or part thereof as objects, and transmits the compressed print data to the CICs 220 via a bus 206 such as a PCI bus. In the embodiment to be described, at least a portion of the print data is compressed using run length encoding (RLE) and the decompression thereof is lossless.

One example of a system for generating raster objects suitable for use with the present invention is disclosed in a co-pending patent application entitled "Method, System, Program, and Data Structure for Generating Raster Objects," filed by the assignee, International Business Machines, Inc., on May 12,2000 with inventors J. T. Varga et. al. and docket number BLD9-2000-0038US1. The referenced application and any patent issuing therefrom is hereby incorporated by reference into this document.

In one embodiment, the rasterizer 204 processes an input data stream of print data that describes what is to be printed by the print engine 222. The rasterizer 204 converts input print data into bitmaps that are in a format that is compatible with the print engine 210 hardware. The print data may be organized into a plurality of objects of text and/or images on a print sheet originally stored in the print controller 104. The print data is then compressed so that it may be transmitted to the CICs 220 over an interface such as the PCI bus interface using a minimum of bandwidth.

One example of a compression scheme suitable for use by the rasterizer 204 of the present invention is disclosed in a co-pending patent application entitled "Color Image Data and Control Bit Compression Scheme with Run Length Encoding," filed by the assignee, International Business Machines, Inc., on Feb. 23, 2000 with inventors J. M. Aschenbrenner et. al. and docket number B09-99-019. The referenced application and any patent issuing therefrom is hereby incorporated by reference into this document.

One example of a method for processing raster data and for merging and screening raster data suitable for use with the present invention is disclosed in a co-pending patent application filed entitled "Method, System, and Logic for Selecting Line Work and Control Data for a Pixel From Multiple Objects of Line Work Data Provided for the Pixel" and was filed by the assignee, International Business Machines, Inc., on May 12,2000 with inventors D. E. Finlay et al. and docket number BLD9-2000-0015US1. The referenced application and any patent issuing therefrom is hereby incorporated by reference into this document.

The output of the rasterizer 204 allows the CICs 220 to render the objects in the compressed data stream by driving the output devices, such as a print head containing lasers or LEDs, within the print engine 222. In an alternative embodiment, the method described herein may be used in data networks to losslessly compress/decompress objects and render the objects on a screen by driving output devices such as LCD arrays within a computer monitor.

In one embodiment, each CIC 220 losslessly decompresses the compressed data stream of print data and transmits that print data via print head signals 216 to feed the print heads. The print head signals 216 preferably transmit various types of decompressed data from the CICs 220, in one embodiment to be described, continuous tone (CT) data, line work (LW) data and line work control (LWC) data are transmitted through the print head signals 216. When the print engine 222 receives a print head signal 216, the signal may contain any or all of the three data types merged together. In one embodiment, a plurality of CICs 208 are multiplexed at the print engine 222 to provide a high capacity print engine with a constant flow of decompressed print data. In the depicted embodiment, four CICs 220 decompress print data in parallel. The CICs 220 are preferably located together in a modular bus interface card, such as a RISC card, local to the print engine 220.

Figure 2A:
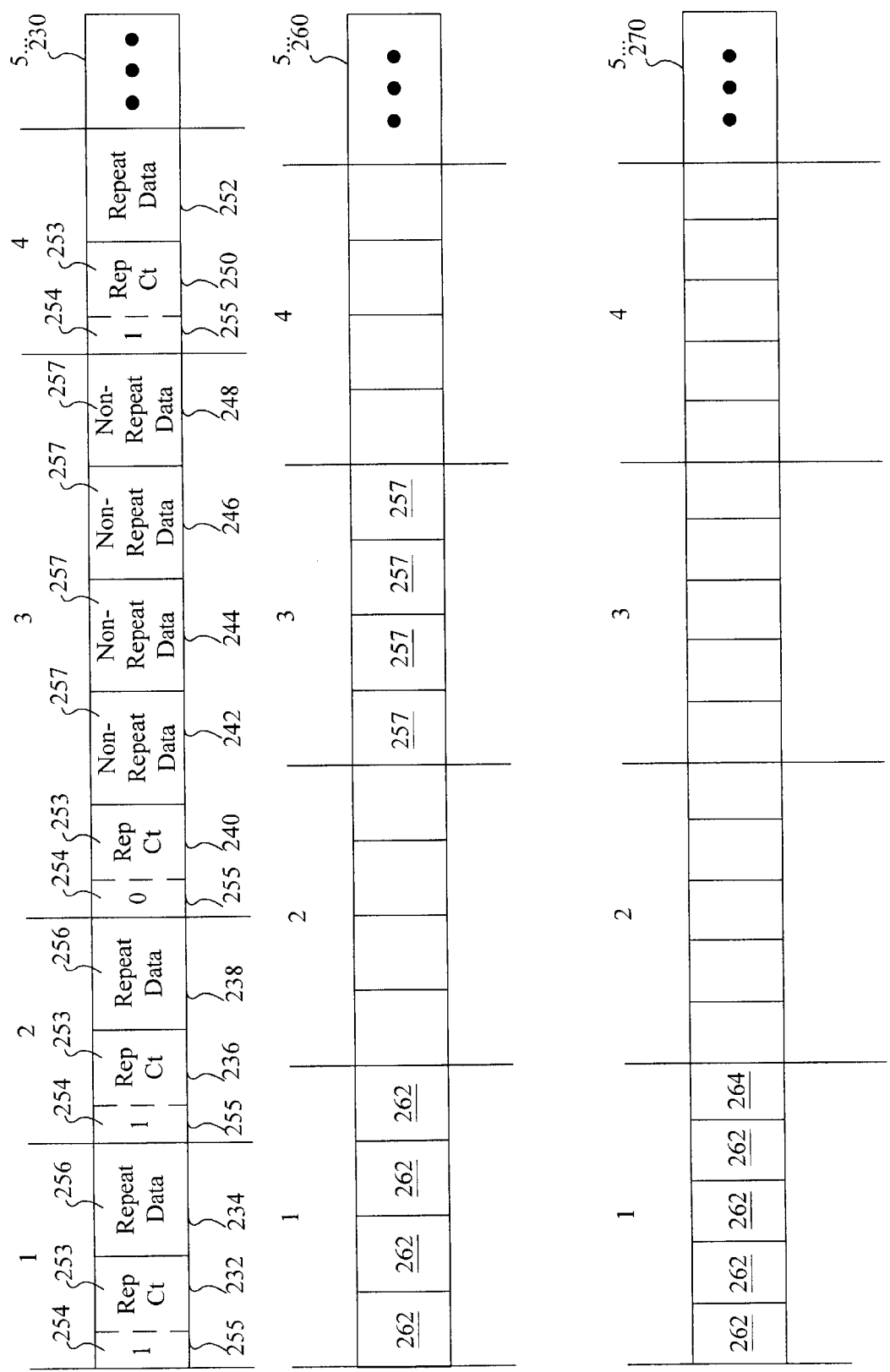
FIG. 2a is a schematic block diagram illustrating an encoded data stream, a decompressed data stream, and a decompressed data stream merged with control bytes.

FIG. 2a illustrates one embodiment of an encoded data stream 230 encoded by the rasterizer 204 and transmitted across a PCI interface to the CICs 220. Each CIC may receive one or more such data streams 230, depending on how many decompression circuits are present on each CIC 220. Also shown in FIG. 2a are a corresponding decompressed data stream 260 that results from the decoding and decompression of the CICs 220 and a merged decoded data stream 270 with in-line Line Work control bytes 264 resulting when a Line Work decompressed data stream such as the data stream 260 is merged with a Line Work Control data stream.

The compressed data stream 230 is shown at four different clock cycles, 1–4. At the first clock cycle, two bytes 232, 234 are presented for processing by a CIC 220. The decompression modules of each CIC 220 each receive a compressed data stream similar to the data stream 230 and process the respective data stream in parallel. The bytes 232, 234 of the first clock cycle are run length encoded, as indicated by the RLE bit 254 which stores a 1 value. The bytes 236, 238 of the second clock cycle, and the bytes 250, 252 of the fourth clock cycle are also run length encoded, while the five bytes passed during the third clock cycle are not run length encoded, as indicated by a 0 in the RLE bit 254 thereof. Of course, the scheme could be reversed, and with a 0 indicating run length encoded data and a 1 indicating non-run length encoded data.

The byte 232 is a control byte 255, and is comprised of the RLE bit 254 and a repeat count 253 occupying the remaining seven bits. The repeat data 254 to be repeated the number of times indicated by the repeat count 253 is transmitted in the following byte 234. In one embodiment, the repeat count 253 indicates the number of times to repeat the repeat data 254, while in a further embodiment, the repeat count 253 is multiplied by a set selected integer, such as four in the preferred embodiment, to calculate the number of times to repeat the repeat data 254.

The processing of the bytes 232, 234 by the CIC 220 results in the transmission of four identical bytes 262 in the data stream 260. In the illustrated case, the repeat count 253 is one, which is multiplied by the selected integer four, to result in the repeat data 254 being repeated four times. Of course, the repeat count 253 varies, and the particular instance where a repeat count 256 of one is given by way of example. The repeat count 253 in the control byte 255 of the second clock cycle is similarly a 1, as is the repeat count 253 of the fourth clock cycle. If the count were two, for instance, in the next clock cycle no new data bytes would be received into the decompression module from the data stream 230, and the decompressed data stream 260 would be provided with four additional repetitions of the repeat data 256.

The third clock cycle has a RLE bit 254 with a 0 value and a repeat count 253 of one, indicating that four non-repeat data bytes 257 follow. When decompressed, these non-repeat data bytes 257 occupy four bytes of the decompressed data stream 260. In cases where the repeat count 253 of a non-run length encoded string such as that of the third clock cycle is greater than one, the successive clock cycles of the compressed data stream 230 are occupied with more non-repeat data 257 in multiples of the selected integer. One clock cycle is thus occupied with four new bytes of non-repeat data 257 for each value of the repeat count 253 greater than one.

Figure 3:
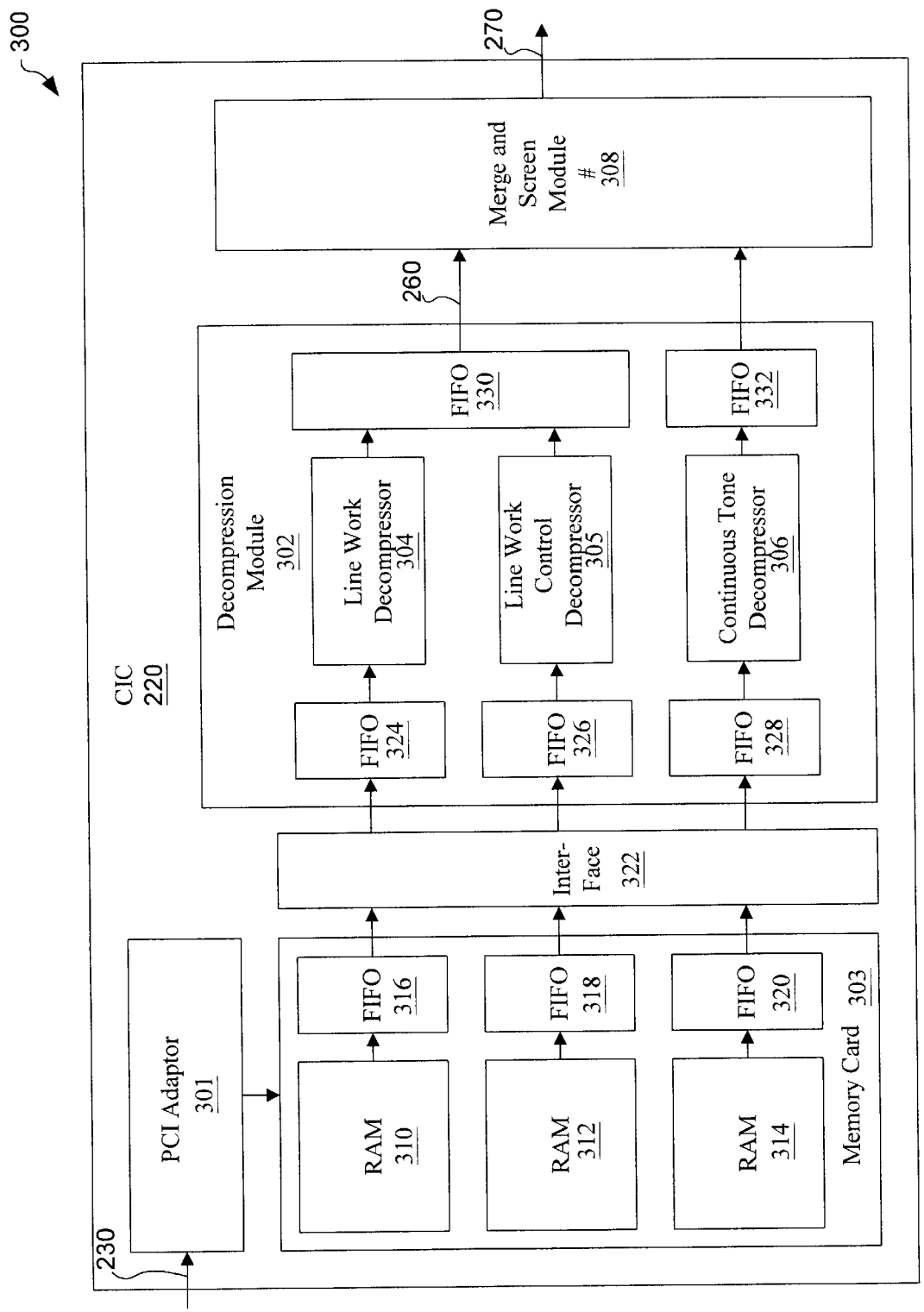
FIG. 3 is a schematic block diagram illustrating one embodiment of a color interface card.

FIG. 3 illustrates one embodiment of a decompression system 300 of the present invention. In the depicted embodiment, the decompression system 300 comprises a color interface card (CIC) 220 of FIG. 2. In the depicted embodiment, the CIC 220 includes a PCI adapter 301, a memory card 303, an interface 322, a decompression module 302, and a merge and screen module 308. The PCI adaptor 301 is preferably configured to receive data streams of compressed print data such as the data stream 230 using the PCI interface and to pass those data streams 230 into the memory card 303.

As depicted, the memory card 303 (given herein as one example of a memory stage) comprises a plurality of RAM memory modules 310, 312, 314 and a plurality of FIFO buffers 316, 318, 320. The data streams 230 received by the PCI adaptor 301 are passed into one of the RAM modules 310, 312, 314 depending on the type of print data in the particular data stream 230. In the depicted embodiment, print data compressed using run length encoding is transferred into the RAM module 310, while control data for that print data is passed to the RAM module 312. Print data compressed using the JPEG format is transferred to the RAM module 314. The respective print data is then passed into the respective FIFO buffers 316, 318, 320, through the interface 322, and into the respective FIFO buffers 324, 326, 328. The interface 322 is preferably configured to handle handshaking duties and keep track of object identification, headers, and coordination of the different print data being transferred through the three separate channels. Other communication lines not shown but well understood in the art are used for this purpose. The FIFO buffers 324, 326, 328 hold the print data of the three data streams until the decompression module 302 is ready for the print data.

The decompression module 302 is shown containing FIFO buffers 324, 326, 328, as well as FIFO buffers 260, 332, a Line Work (LW) decompressor 304, a Line Work and Control (LWC) decompressor 305, and a Continuous Tone (CT) decompressor 306. In one embodiment, the rasterizer 204 of FIG. 2 separates and transmits CT, LW, and LWC data to the CIC 220. The LW decompressor 302, the LWC decompressor, and the CT decompressor 306 decompress the print data transmitted from the rasterizer 204 of FIG. 2 and simultaneously transmit the decompressed print data through the FIFO buffers 330, 332 to the merge and screen module 308. The merge and screen module 308 then merges the print data from each of the decompressors, screens the print data, and then transmits the print data to the print engine 222 of FIG. 2 where the decompressed print data is fed into print heads. In one embodiment, a plurality (eight in the depicted embodiment) of concurrently decompressed print data streams 270 are transmitted to the print engine 222 at once, preferably through four fiber channel interfaces.

In one preferred embodiment, each CIC 220 comprises a plurality of decompression modules identical to the decompression module 302 shown. In one embodiment, each CIC 220 contains two such modules 302. Each CIC 220 preferably also comprises a corresponding plurality of merge and screen modules identical to the merge and screen module 308 shown. The existence of a plurality of decompression modules and merge and screen modules per CIC 220 allows each CIC 220 to decompress a plurality of incoming data streams simultaneously in a parallel fashion.

Figure 4:
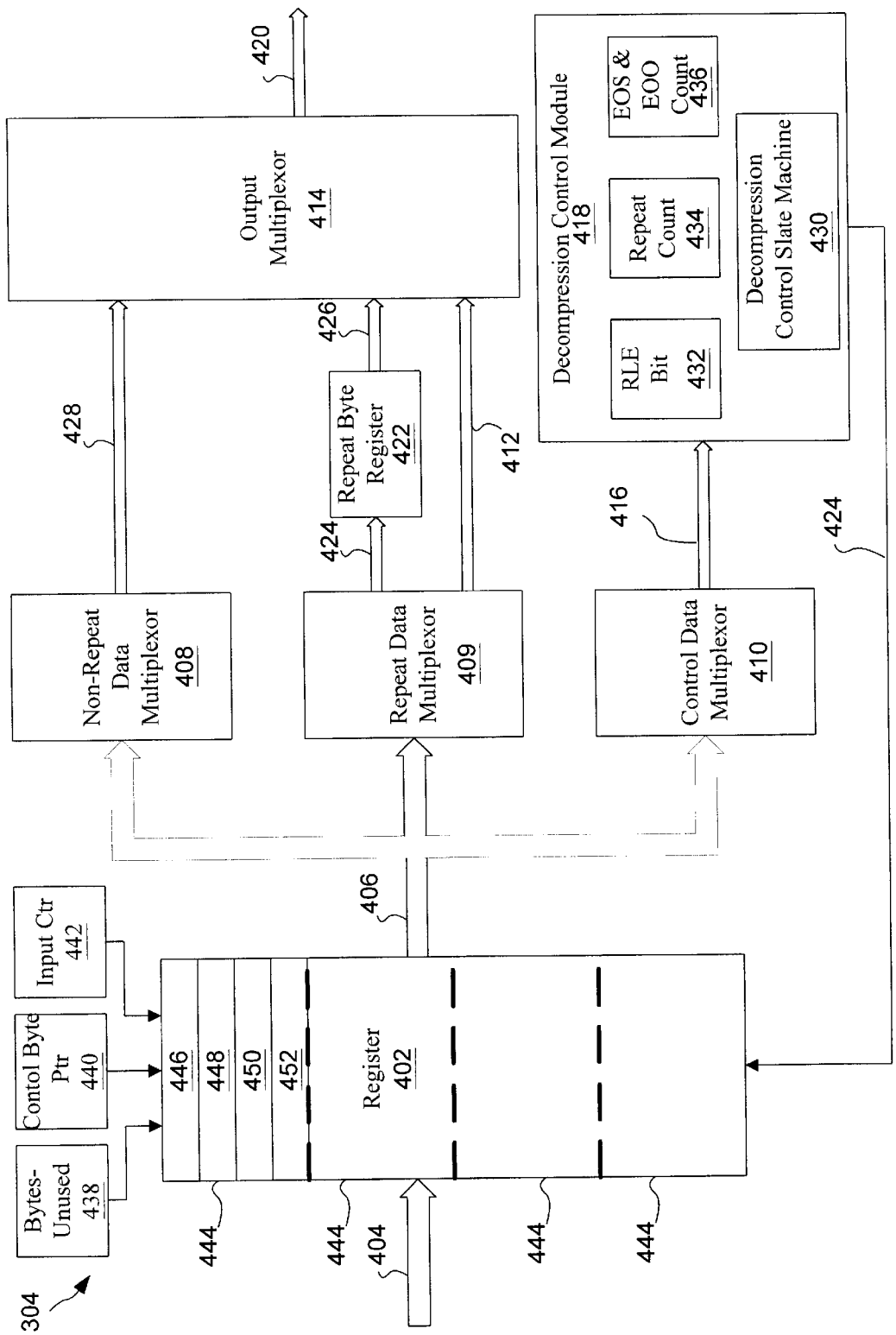
FIG. 4 is a schematic block diagram illustrating one embodiment of a decompression system of the present invention.

FIG. 4 illustrates one embodiment of a linework (LW) decompression module 304. Preferably, together in each decompression circuit of each CIC 220 with each LW decompression module 304 is a corresponding LWC decompression module 305, which operates in a similar fashion to the LW decompression module 304, as will be described, and a continuous tone decompressor 306 for decompressing JPEG data streams. The operation of JPEG decompressors are well known in the art, and the manner of operation of the CT decompressor 306 will be readily apparent from prior art decompressors and the discussion herein. The LW decompression module 304 is shown containing a register 402, and an initial stage of multiplexors including a non-repeat byte multiplexers 408, a repeat data multiplexor 409, and a control data multiplexor 410. An output stage multiplexor (hereafter output multiplexor) 414 is also shown, together with a repeat byte register 422 and a control module 418.

In one embodiment, print data, such as that of the data stream 230 of FIG. 2a, run length encoded by the rasterizer 204 of FIG. 2 is received by the LW decompression module 304 via a data bus 404 from the FIFO buffer 324 of FIG. 3. The print data is then stored in the register 402 until it can be processed. A bytes-unused counter 438, a combined control byte and data pointer 440 and an input counter 442 keep track of the contents of the register and allow one of the four slots 442 shown therein to be fed a predetermined number of bytes at a time in a rotating, barrel counter manner, as will be discussed in greater detail below with respect to FIG. 7.

Preferably, print data within the register 402 is received by the input stage multiplexors 408, 409, 410 in one of a plurality of selected multiples of bytes every clock cycle in the preferred embodiment. During each clock cycle, a control byte 255, the position of which is indicated by the control byte pointer 440, is first received into the control data multiplexor. The RLE bit 254 is then received into the RLE bit storage location 432 and examined to determine whether the following string of bytes is run length encoded. The repeat count 253 is correspondingly stored into the repeat count storage location 434.

The control module 418 is configured to examine the RLE bit 255 and the repeat data byte 256 and determine whether the following data byte(s) are run length encoded or not run length encoded. If the RLE bit 255 indicates that the data is run length encoded, the control module 418 examines the repeat count 253 and determines how many times to repeat the following repeat data byte 256 (e.g., byte 234 of FIG. 2a). In one embodiment, the repeat data byte 256 is repeated a number of times calculated by multiplying the selected integer multiple times the repeat count. In a preferred embodiment, the selected integer is four. Thus, when the repeat count is 1, the repeat byte 254 is repeated into the output multiplexor 414 four times. When the repeat count is 2, the repeat byte 254 is repeated eight times, four times in the current clock cycle, and four times in the subsequent clock cycle.

After receiving the control byte 255 and determining that the string (of two bytes in the preferred embodiment) is run length encoded, the control module goes into a RLE state, as will be described with respect to FIGS. 5 and 6, and causes the repeat data byte 254 following the control byte 255 to be passed into the repeat data multiplexor 409. The repeat data byte 254 is then latched into the repeat byte register 422 and repeated the prescribed number of times into the output multiplexor 414. In order to save time, the first instance of the repeat byte 254 is preferably passed straight through to the output multiplexer 414 on the channel 412.

The control module 418 also preferably maintains a record of the status of the register 402 using the bytes-unused counter 438, the control byte and data pointer 440, and the input counter 442. When a string of data bytes has been processed, the control module 418 decrements the bytes-unused counter 438 and checks to see whether there is sufficient space in the register to receive additional data from the rasterizer 204 of FIG. 2.

As will be discussed, two other specialized cases of run length encoding may be indicated by the RLE bit 432 and the repeat count 434 to which the control module 418 responds by repeating the repeat data byte 256 to the end of an object or to the end of a scan line. If the control byte 235 indicates that the current string of print data in the data stream 230 is not run length encoded, as in the third clock cycle of the data stream 230 of FIG. 2a, four bytes of print data are received into the non-repeat data multiplexor 408 and are passed as-is to the output multiplexor 414. If the repeat count 253 is greater than one, the next four bytes are accessed within the register 402 during the next clock cycle, passed to the non repeat data multiplexor 408 and on to the output multiplexor 414. This process is continued for every integer greater than one of the repeat count 253. The repeat count is decremented during every clock cycle within the repeat count storage location 434.

In a preferred embodiment, the register 402 comprises a sixteen byte by eight bit barrel shift register. The multiplexers 408 comprises a first bank of four byte to one byte multiplexers and a second bank of four-byte-to-one-byte multiplexers. The multiplexer 410 comprises a single 16-byte-to-one-byte multiplexer. The multiplexer 414 comprises a bank of eight two-byte-to-one-byte multiplexers.

In a second preferred embodiment, preferably employed for the LWC decompression module 305, the register 402 comprises an eight byte by eight bit barrel shift register. The multiplexer 408 comprises an eight-byte-to-one byte multiplexer as does the multiplexer 410. The multiplexer 414 comprises a bank of eight two-to-one-multiplexers.

The LWC decompressor 305 of FIG. 3 preferably operates in a manner similar to that of the LW decompressor 304 described above. In one embodiment, for every four bytes of print data decompressed in a clock cycle by the LW decompressor 304, only a single byte of control data is decompressed by the LWC decompressor 305. Accordingly, instead of working by multiples of fours, the LWC decompressor 305 may work in multiples of ones and twos. Thus, for example, the input stage register of the LWC decompressor 305 may have only two slots of four bytes each, rather than the four slots of four bytes each of the LW control register 402. Additionally, instead of each repeat byte being repeated in multiples of four, the repeat bytes are repeated only one at a time. Additionally, non-repeat data is passed through on a one-to-one correlation with the repeat count of the LWC decompressor 305. Of course, other multiples of bytes and slots and repeat count multiplication could be used for either decompression module.

In one embodiment, the decompression module 304, the line work decompressor 304, and/or the Line Work Control decompressor 305 are implemented with a programmable logic device such as the Xilinx XCV 400 BG432-4. Alternatively, these components may be implemented using an application specific integrated circuit (ASIC), discrete logic devices, or a microprocessor employing microcode or higher level software.

Figure 5:
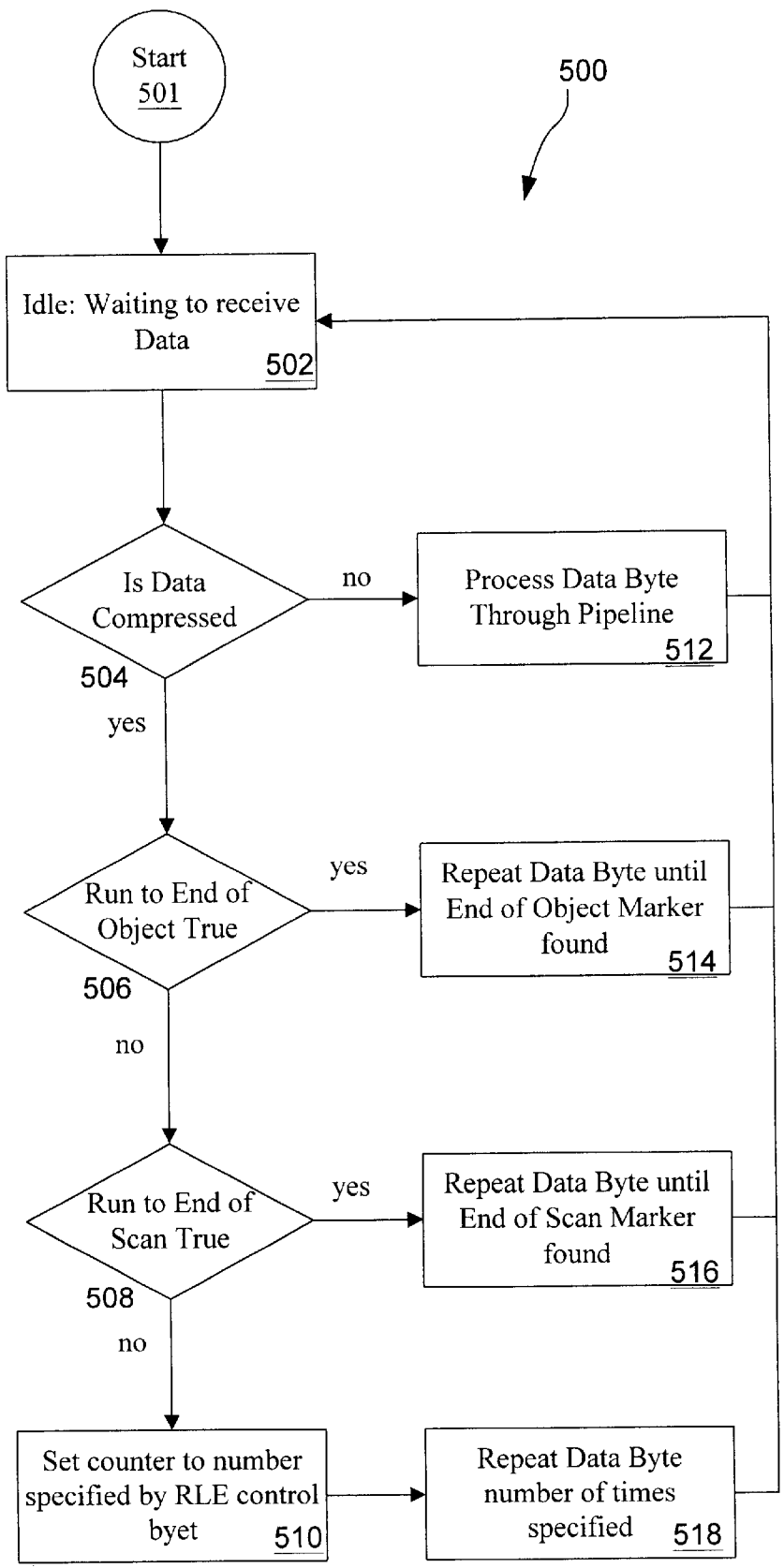
FIG. 5 is a flow diagram illustrating one embodiment of a print data decompression control process for use with the present invention.

FIG. 5 is a schematic flow chart diagram illustrating one embodiment of the process 500 that the LW decompressor 304 uses to control the output of the register 402 of FIG. 4. The state machine 500 is initially in an idle state as shown in a step 502. When a control byte is in received in the multiplexer 410 of FIG. 4, the state machine 500 reads the RLE bit 255 in a step 504 to determine whether the data is in a run length encoded format. If the data is not in a run length encoded format, the data is transmitted as-is through the data multiplexer 408 of FIG. 4 to the print engine 222 of FIG. 1 in a step 512. As will be discussed, the non-repeat data is passed through in multiples of the selected integer in an amount indicated by the repeat count 254.

If the data is in a run length encoded format, the control module 418 of FIG. 4 checks to see if a run to end of object condition is true in a step 506. If the run to end of object condition is true, the data is repeatedly sent to the print engine 222 of FIG. 1 in a step 514 until an end of object marker is found. In one embodiment, the run to end of object condition occurs when the repeat count 253 is zero and the RLE bit 254 is 0. If the run to end of object condition is false, the state machine 426 of FIG. 4 checks to see if a run to end of scan condition is true in a step 508. In the preferred embodiment, the run to end of scan condition occurs when the repeat count 253 is zero and the RLE bit 254 is a 1.

Figure 1:
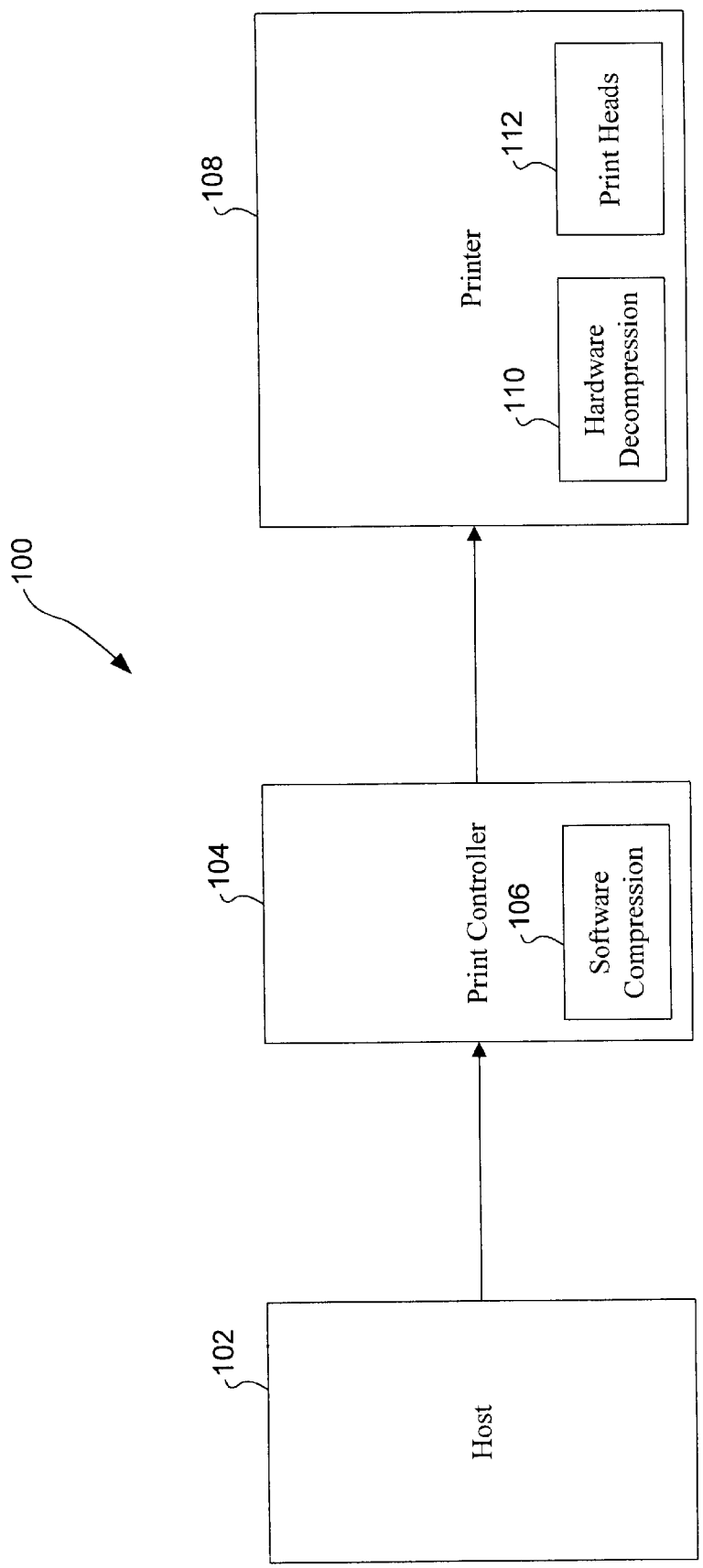
FIG. 1 is a schematic block diagram illustrating one embodiment of a printer system that uses data compression and decompression techniques.

If the run to end of scan condition is true, the repeat data byte is stored in the repeat byte register 422 and replicated and sent to the print engine 222 of FIG. 1 in a step 516 until an end of scan marker is found. If the run to end of scan condition is not true, the repeat count 434 is used within the state machine 426 of FIG. 4 to replicate the repeat data byte 256 for a specified number of counts indicated by the repeat count 253 at a step 510. The replicated data is then transmitted to the print engine 222 of FIG. 1 in a step 518. The data is repeated the number of time specified by the count (e.g., the repeat count 253 loaded into the repeat count memory location 434) of the step 510.

Figure 6:
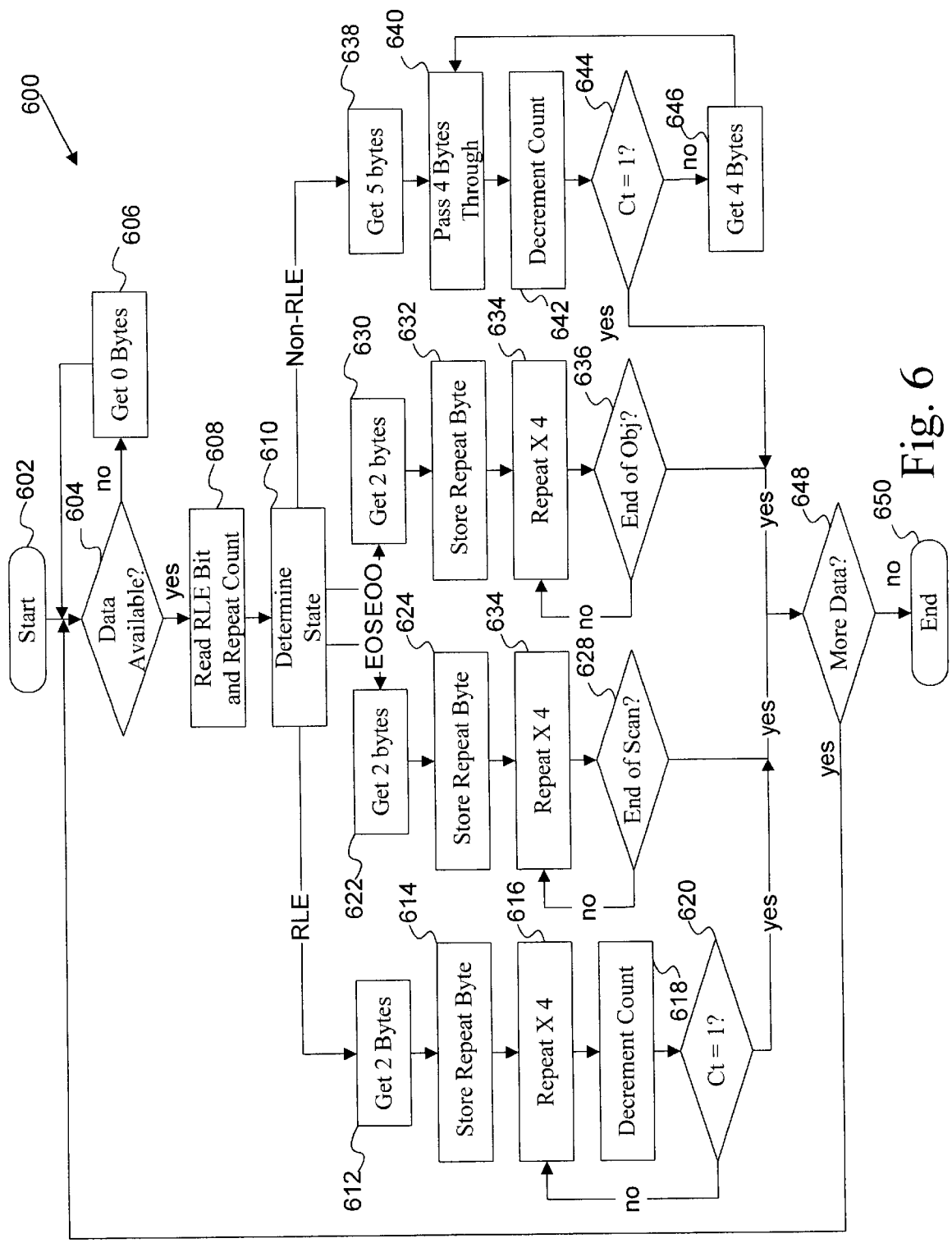
FIG. 6 is a schematic flow chart diagram illustrating one embodiment of a method of data decompression for use with the present invention.

FIG. 6 is a schematic flow diagram illustrating a method 600 of data decompression of the present invention. The method 600 starts at a step 602. At a step 604, logic within the control module 418 of FIG. 4 monitors the state of the register 402 of FIG. 4 to determine whether print data is available and if so, determines the location of the control byte 255 of the next string of print data. One manner of continually filling the register 402 as print data is accessed is described below with respect to FIG. 7. If data is not available within the register 402, the LW decompressor 304 waits a clock cycle before checking again, as indicated by a step 606.

In a step 608, the RLE bit of the control byte 255 is read. This preferably comprises accessing the control byte 255 using the control byte pointer 440 and storing the RLE bit in the RLE bit storage location 432 as described above. The repeat count 434 is preferably also stored in the repeat count storage location 434 as discussed and is also examined. At a step 610, the control module 418 goes into a predetermined state according to the information in the control byte 255. In one embodiment, one of four states may be entered, as discussed above with respect to FIG. 5.

If the state data string is determined to be run length encoded, the RLE state is entered, and the method 600 progresses to a step 612. At the step 612, a second byte is accessed from the register 402 in addition to the control byte 255 which was already passed to the control data multiplexor 410 at the step 608. The second byte is the repeat data byte 254. The bytes-unused counter 439 is subsequently incremented by two bytes, as is the control byte pointer 440. At a step 614, the repeat data byte 254 is passed into the repeat data multiplexor 409 and then stored in the repeat byte register 422.

At a step 616, the repeat data byte is repeated and transmitted to the output multiplexor 414 the selected integer number of times—four times in the depicted embodiment. As discussed, the first iteration of the repeat byte 254 is preferably passed straight through to the output multiplexor 414 through the channel 412 to achieve a faster rate of data flow. At a step 618, the count stored in the repeat count register 434 is decremented by one. At a decision step 620, the control module 418 checks to see whether the repeat count 434 is 1 or higher than 1. If it is higher than one, the method loops to step 616 on the next clock cycle. If it is 1, the method 600 proceeds to the step 648 and loops back to the beginning if more data is available. If there is no more data in the current print job, the method 600 ends.

Returning to the step 610, if the control byte 255 indicates that the next string in the register 402 is an end of scan string, the EOS state is entered ,and the method 600 progresses to the step 624. At the step 624, a second byte is received in addition to the control byte 255 which has already been received into the control data multiplexor 410. The second byte comprises the repeat data byte 254, which is received into the repeat data multiplexor 409. The bytes-unused counter 438 is updated by two, as is the control byte pointer 440.

At a step 624, the repeat data byte 254 is stored in the repeat byte register 422. At a step 626, the repeat data byte 254 is passed four times to the output multiplexor 414. At a step 628, the control module 418 checks to see whether an end of scan flag has been encountered. If not, the method loops back to the step 626 on the next clock cycle, and if so, the method progresses to the step 648. In one embodiment, the end of object and end of scan are calculated by data passed through the additional control lines which indicates the width and size of the object. Counters within the control module 418 keep count of the location within a scan and within an object and set the respective flags when an end of scan and an end of object are reached.

Returning to the step 610, if the control byte 255 of the present string indicates that the string is an end of object string, the method 600 enters an EOO state and progresses to a step 630. At the step 630, a second byte is received in addition to the control byte 255 which was received at the step 608 into the control data multiplexor 410. The second byte comprises the repeat data byte 254, which is received into the repeat data multiplexor. The bytes-unused counter 438 is updated by two, as is the control byte pointer 440.

At a step 632, the repeat data byte 254 is stored in the repeat byte register 422. At a step 634, the repeat data byte 254 is passed four times to the output multiplexor 414. At a step 636, the control module 418 checks to see whether an end of object flag has been encountered. If not, the method loops back to the step 634 on the next clock cycle, and if so, the method progresses to the step 648.

Returning back to the step 610, if the control data byte 255 indicates that the current string is not run length encoded, a Non-RLE state is entered. At a step 638, four more bytes are passed from the register 402 in addition to the control data byte 255 which was passed at the step 608. The four bytes contain non-repeated data 257. The four non-repeat data bytes 257 are received into the non-repeat data multiplexor 408. At a step 640, the four bytes of non-repeat data are passed to the output multiplexor through a channel 428. At a step 642, the repeat count 254 stored in the repeat count storage location 434 is decremented by one.

At a decision step 644, the control module 418 checks the repeat count 254 to see if it is one. If it is not, the method 600 progresses to a step 646. At the step 646, the next four bytes within the register 402 which are also non-repeat data bytes are received into the non-repeat data multiplexor 408 during the next clock cycle and the method loops back to the step 640. If the count is determined to be equal to 1, the method 600 progresses to the step 648.

The method of operation of the LWC decompressor 305 is similar, except as discussed, in the preferred embodiment, the register 402 has only two slots of four bytes each, and the selected integer is 1.

Figure 7:
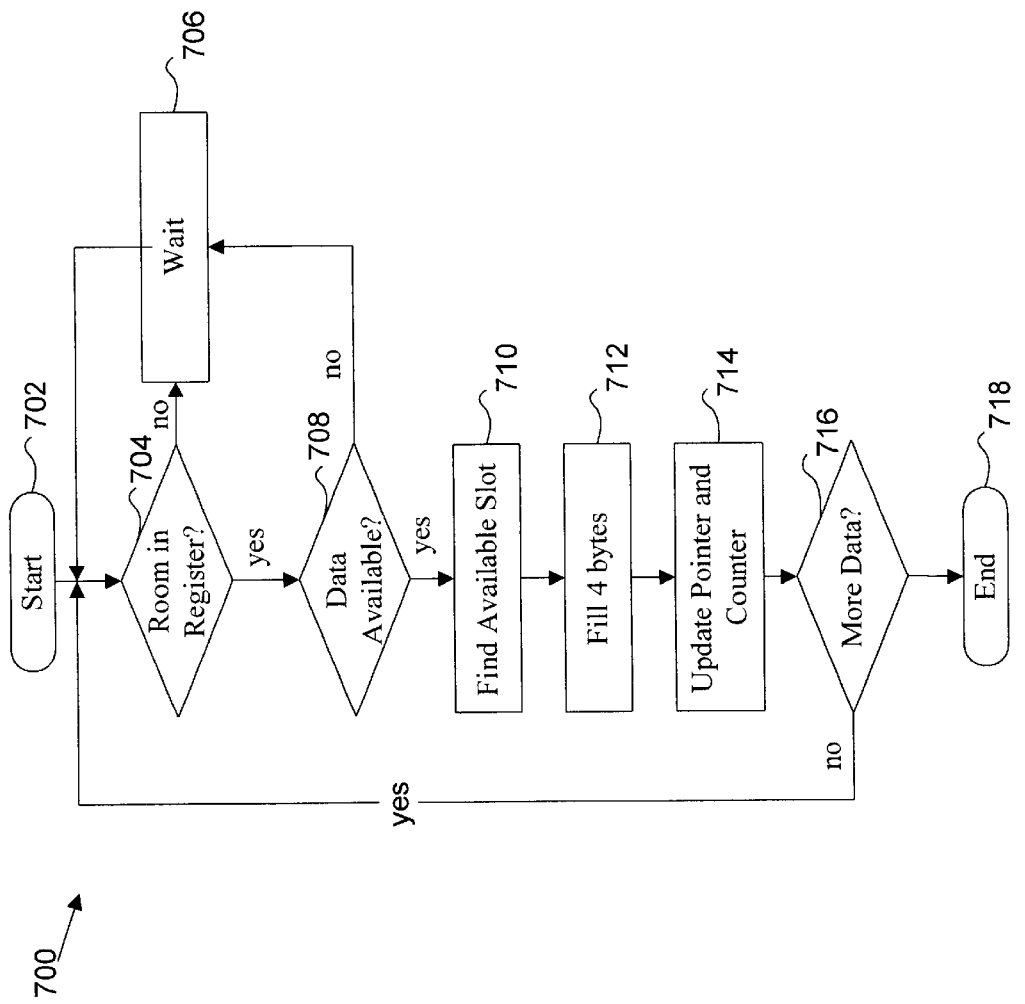
FIG. 7 is a schematic flow chart diagram illustrating one embodiment of a method of loading data into a memory stage of the present invention.

FIG. 7 is a schematic flow chart diagram illustrating one embodiment of a method 700 for continuously filling the register 402 with a compressed data stream. The method 700 begins at a step 702 and progresses to a decision step 704. At the step 704, the control module 418 of FIG. 4 determines whether there is room in the register 402 for more data. In the preferred embodiment, one slot 444 of the register 402 is filled at a time with four bytes during a clock cycle. Of course other numbers of slots and bytes per slot could also be filled during a clock cycle. To determine whether there is room in the register 402, the bytes-unused counter 438 is preferably consulted. The bytes-unused counter 438 is preferably updated every time data is taken out of the register 402 and keeps track of when an entire slot 444 becomes open. If no slots are open, the method 700 waits at a step 706 and checks again during the next clock cycle.

If there is room in the register 402, the control module 418 checks to see if there is print data available. This preferably comprises checking one of the FIFOs 324, 326, 328 of FIG. 3 to see if four bytes are present for transfer. If the data is available, the available slot is located. This preferably comprises referencing the input counter 442 which keeps track of which slot 444 was last filled. At a step 712, the available slot 444 is filled with four bytes of data. At a step 714, the bytes-unused counter 438 and the input counter 442 are updated. At a decision step 716, the control module 418 checks to see if more data is to be transferred during the present print job. If so, the method 706 loops back to the step 704 during the next clock cycle. Otherwise, the method 700 ends at the step 718.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A data decompression system, comprising:
    a storage stage configured to receive and store a plurality of print data elements received within a compressed data stream, the print data elements comprising repeat data elements, non-repeat data elements, and control elements;
    an initial multiplexing stage coupled to the storage stage and configured to separately receive control and data elements from the compressed data stream;
    a control module coupled to the initial multiplexing stage and configured to select a different number of the print data elements to be received at the initial multiplexing stage according to a state as determined by information in a control element of the compressed data stream and to coordinate reproduction of repeat data elements; and
    an output multiplexing stage coupled to the control module and the initial multiplexing stage and configured to combine the repeat data elements with non-repeat data elements for subsequent transmission.

2. The data decompression system of claim 1, wherein the storage stage comprises a barrel shift register.

3. The data decompression system of claim 2, wherein the barrel shift register comprises a plurality of fixed slots of multiple bytes and is configured to receive a plurality of print data elements into one slot at a time in rotating order.

4. The data decompression system of claim 1, further comprising a control element pointer communicating with the storage stage and configured to indicate a storage location of a control element within the storage stage.

5. The data decompression system of claim 1, further comprising a capacity counter communicating with the storage stage and configured to indicate a number of storage locations left unused within the storage stage.

6. The data decompression system of claim 1, further comprising an input counter communicating with the storage stage and configured to indicate a storage location of a most recently received element within the storage stage.

7. The data decompression system of claim 1, wherein the initial multiplexing stage further comprises a plurality of multiplexers for use in selecting a data element of the compressed data stream.

8. The data decompression system of claim 1, wherein the initial multiplexing stage further comprises a non-repeat data element multiplexer for use in selecting non-repeat data elements of the compressed data stream.

9. The data decompression system of claim 1, wherein the initial multiplexing stage further comprises a repeat data element multiplexer for use in selecting repeat data elements of the compressed data stream.

10. The data decompression system of claim 1, wherein the initial multiplexing stage further comprises a control element multiplexer for use in selecting control elements of the compressed data stream.

11. The data decompression system of claim 1, further comprising a run length encoding bit storage location within the control module for storing a run length encoding bit of a control element which indicates whether subsequent print data elements are run length encoded.

12. The data decompression system of claim 1, further comprising a repeat count storage location for storing a repeat count of how many times to repeat a repeat data element.

13. The data decompression system of claim 12, wherein the repeat count represents multiples of an integer number greater than one for which to repeat a repeat data element.

14. The data decompression system of claim 12, wherein the repeat count also indicates a multiple of the integer number greater than one for which to receive non-run length encoded print data elements into the output multiplexer stage.

15. The data decompression system of claim 1, further comprising a compressed data stream fed into the storage stage and a print engine coupled to an output of the output multiplexer stage.

16. The data decompression system of claim 15, further comprising a plurality of data decompression systems configured as recited in claim 1 multiplexed into the print engine.

17. The data decompression system of claim 1, further comprising a First-In First-Out buffer communicating with the storage stage, and wherein the compressed data stream is fed into the storage stage from the First-In First-Out buffer.

18. The data decompression system of claim 1, wherein the storage stage, initial multiplexing stage, control module, and output multiplexing stage are implemented primarily with discrete logic devices.

19. The data decompression system of claim 1, wherein the storage stage, initial multiplexing stage, control module, and output multiplexing stage are implemented primarily with one of a programmable logic device and an application specific integrated circuit (ASIC).

20. The data decompression system of claim 1, wherein the storage stage, initial multiplexing stage, control module, and output multiplexing stage are implemented primarily with software.

21. The data decompression method of claim 1, wherein the storage stage comprises a barrel shift register having a plurality of fixed slots of multiple bytes and further comprising receiving a plurality of print data elements into the barrel shift register one slot at a time in rotating order.

22. The data decompression system of claim 1, further comprising:
    indicating a storage location of a control element within the storage stage
    indicating a number of storage locations left unused within the storage stage;
    indicating the storage location of a most recently received print data element within the storage stage;
    selecting the control element out of the compressed data stream;

selecting non-repeat data element of the compressed data stream;

selecting repeat data element of the compressed data stream;

storing a run length encoding bit of a control element which indicates whether a following print data element is run length encoded;

storing a repeat count indicating how many times to repeat a repeat data element;

passing a non-repeat data element through in multiples of an integer greater than zero;

combining a decompressed print data element stream with a decompressed control element stream; and combining a plurality of concurrently decompressed data element streams into a single data element stream for transmission to a print head.

23. A data decompression system for receiving a compressed data stream, decompressing the data stream, and passing the decompressed data stream to a print engine, comprising:

a First-In-First-Out buffer configured to buffer a compressed data stream, the compressed data stream comprising a plurality of print data elements including repeat data elements, non-repeat data elements, and control elements;

a barrel shift register configured to receive and store elements received within the compressed data stream from the First-In-First-Out buffer, the barrel shift register comprising a plurality of fixed slots of multiple bytes configured to receive a plurality print data elements into one slot at a time in rotating order;

a control element pointer communicating with the barrel shift register and configured to indicate a fixed slot of a control element within the barrel shift resister;

a capacity counter communicating with the barrel shift register and configured to indicate a number of storage locations left unused within the First-In-First-Out buffer;

an input counter communicating with the barrel shift register and configured to indicate a storage location in the First-In-First-Out buffer of a most recently received print data element;

a plurality of multiplexers coupled to the barrel shift register and configured to separately receive control elements, repeat data elements, and non-repeat data elements from the compressed data stream, the plurality of multiplexers comprising an initial multiplexing stage;

a control module coupled to the initial multiplexing stage and configured to select a different number of print data elements at the initial multiplexing stage according to a state as determined by information in a control element of the compressed data stream and to coordinate reproduction of repeat data elements, the control module comprising:

a run length encoding bit storage location within the control module for storing a run length encoding bit of a control element which indicates whether a subsequent print data element is run length encoded; and a repeat count storage location for storing a repeat count of how many times to repeat a repeat data element, the repeat count representing multiples of an integer number greater than one for which to repeat the repeat data element and for which to receive a non-run length encoded print data element into an output multiplexer stage;

a repeat register for latching a data element to be repeated in accordance with the control module;

the output multiplexer stage coupled to the control module and the initial multiplexing stage and configured to combine the repeat data elements with non-repeat data elements for subsequent transmission.

24. A method for decompressing data, comprising:

receiving and storing a plurality of print data elements within a compressed data stream, the print data elements including repeat data elements, non-repeat data elements, and control elements;

separating out control and data elements from the compressed data stream;

selecting a different number of print data elements at an initial multiplexing stage according to a state as determined by information in a control element of the compressed data stream;

repeating a repeat data element a prescribed number of times;

passing a non-repeat data element through as-is; and combining the repeat data elements with the non-repeat data elements for subsequent transmission.

* * * * *

UNITED STATES PATENT AND TRADEMARK OFFICE
CERTIFICATE OF CORRECTION

PATENT NO.    : 6,657,561 B1
DATED         : December 2, 2003
INVENTOR(S)   : Stephen Dale Hanna It is certified that error appears in the above-identified patent and that said Letters Patent is hereby corrected as shown below:

Column 3,
Line 53, "May 12,2000" should read -- May 12, 2000 --.
Line 61, "engine 210" should read -- engine 222 --.

Column 4,
Line 33, "220, in" should read -- 220, and in --.
Line 45, "engine 220" should read -- engine 222 --.
Line 46, "encoded data" should read -- encoded and compressed data --.

Column 5,
Line 9, "254" should read -- 256 --.
Line 9, "254" should read -- 256 --.
Line 9, "254" should read -- 256 --.
Line 9, "254" should read -- 256 --.
Line 9, "256" should read -- 253 --.

Column 6,
Line 11, "buffers 260," should read -- buffers 330, --.

Column 7
Line 13, "255" should read -- 254 --.
Lines 32 and 34, "254" should read -- 256 --.
Line 48, "432" should read -- 254 --.
Line 49, "434" should read -- 253 --.
Line 51, "235" should read -- 255 --.

Column 8,
Line 29, "304," should read -- 302, --.
Lines 40 and 42, "state machine" should read -- process --.
Line 43, "255" should read -- 254 --.
Line 49, "254" should read -- 253 --.
Line 58, "426" should read -- 430 --.
Line 66, "424" should read -- 252 --.

Column 9,
Line 1, "426" should read -- 430 --.
Line 24, "repeat count 434" should read -- repeat count 253 --.
Line 36, "counter 439" should read -- counter 438 --.
Line 57, "entered ,and" should read -- entered, and --.
Line 58, "step 624," should read -- step 622, --.
Lines 61 and 65, "254" should read -- 256 --.

UNITED STATES PATENT AND TRADEMARK OFFICE
CERTIFICATE OF CORRECTION

PATENT NO. : 6,657,561 B1
DATED : December 2, 2003
INVENTOR(S) : Stephen Dale Hanna It is certified that error appears in the above-identified patent and that said Letters Patent is hereby corrected as shown below:

Column 10,
Lines 1, 18, 21 and 23, "254" should read -- 256 --.
Lines 37 and 40, "254" should read -- 253 --.

Column 11,
Line 12, "706" should read -- 700 --.

Column 13,
Line 30, "plurality print data" should read -- plurality of print data --.

Signed and Sealed this

Twenty-second Day of June, 2004

JON W. DUDAS
*Acting Director of the United States Patent and Trademark Office*